(12) United States Patent
Jung et al.

(10) Patent No.: US 10,211,384 B2
(45) Date of Patent: Feb. 19, 2019

(54) LIGHT EMITTING DIODE APPARATUS AND MANUFACTURING METHOD THEREOF

(71) Applicant: SAMSUNG ELECTRONICS CO., LTD., Suwon-si (KR)

(72) Inventors: Jong-hoon Jung, Suwon-si (KR); Dae-sik Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 62 days.

(21) Appl. No.: 15/364,806

(22) Filed: Nov. 30, 2016

(65) Prior Publication Data

US 2017/0279022 A1 Sep. 28, 2017

Related U.S. Application Data

(60) Provisional application No. 62/313,888, filed on Mar. 28, 2016.

(30) Foreign Application Priority Data

Jun. 21, 2016 (KR) .......................... 10-2016-0077322

(51) Int. Cl.
*H01L 27/15* (2006.01)
*H01L 33/64* (2010.01)
*H01L 33/46* (2010.01)

(52) U.S. Cl.
CPC ............ *H01L 33/64* (2013.01); *H01L 27/156* (2013.01); *H01L 33/46* (2013.01)

(58) Field of Classification Search
CPC ......... H01L 33/46; H01L 33/64; H01L 27/15; H01L 27/156

(Continued)

(56) References Cited

U.S. PATENT DOCUMENTS 8,354,665 B2 * 1/2013 Jiang ................... H01L 25/0753
257/13
8,642,363 B2 * 2/2014 Lau ....................... H01L 27/156
257/E21.499

(Continued)

FOREIGN PATENT DOCUMENTS

CN 102214650 A 10/2011
JP 2008-153700 A 7/2008

(Continued)

OTHER PUBLICATIONS

International Search Report (PCT/ISA/210) dated Mar. 13, 2017 issued by the International Searching Authority in counterpart International Application No. PCT/KR2016/014205.

(Continued)

*Primary Examiner* — Monica D Harrison
(74) *Attorney, Agent, or Firm* — Sughrue Mion, PLLC

(57) ABSTRACT

An LED apparatus is provided. The LED apparatus includes a plurality of substrate layers, each substrate layer corresponding to one of a plurality of sub-pixels of a pixel; a heat sink plate provided on a first side of each substrate layer, the heat sink plate including a patterned area provided between adjacent substrate layers of the plurality of substrates layers; a fluorescence provided on the heat sink plate overlapping at least a portion of one of the plurality of substrate layers; and a plurality of light emitting diodes, each light emitting diode formed on a second side opposite to the first side of each substrate layer.

16 Claims, 17 Drawing Sheets

(58) Field of Classification Search
USPC .......................................................... 257/89
See application file for complete search history.

(56) References Cited

U.S. PATENT DOCUMENTS

| | | | |
|---|---|---|---|
| 8,877,530 | B2 | 11/2014 | Seong |
| 9,059,114 | B2 * | 6/2015 | Do ...................... H01L 25/0753 |
| 9,224,910 | B2 | 12/2015 | Seong |
| 2011/0127567 | A1 | 6/2011 | Seong |
| 2011/0299044 | A1 | 12/2011 | Yeh et al. |
| 2012/0091481 | A1 | 4/2012 | Sekine et al. |
| 2014/0065746 | A1 | 3/2014 | Seong |
| 2014/0312368 | A1 | 10/2014 | Lee et al. |
| 2014/0377895 | A1 | 12/2014 | Seong |
| 2015/0017750 | A1 | 1/2015 | Sugizaki et al. |
| 2015/0137163 | A1 | 5/2015 | Harris |
| 2015/0171277 | A1 | 6/2015 | Saito |
| 2015/0371975 | A1 | 12/2015 | Shimizu et al. |

FOREIGN PATENT DOCUMENTS

| | | |
|---|---|---|
| JP | 2011-253998 A | 12/2011 |
| JP | 2012-89646 A | 5/2012 |
| JP | 2015-119030 A | 6/2015 |
| KR | 10-2005-0063254 A | 6/2005 |
| KR | 10-1231118 B1 | 2/2013 |
| KR | 10-2014-0006485 A | 1/2014 |
| KR | 10-1362081 B1 | 2/2014 |
| KR | 10-2015-0089849 A | 8/2015 |
| KR | 10-2015-0119179 A | 10/2015 |

OTHER PUBLICATIONS

Written Opinion (PCT/ISA/237) dated Mar. 13, 2017 issued by the International Searching Authority in counterpart International Application No. PCT/KR2016/014205.

Communication dated Nov. 16, 2018, issued by the European Patent Office in counterpart European Application No. 16897216.4.

* cited by examiner

LIGHT EMITTING DIODE APPARATUS AND MANUFACTURING METHOD THEREOF

CROSS-REFERENCE TO RELATED APPLICATIONS

This application claims priority from Korean Patent Application No. 10-2016-0077322, filed in the Korean Intellectual Property Office on Jun. 21, 2016, and U.S. Provisional Application No. 62/313,888, filed in the United States Patent and Trademark Office on Mar. 28, 2016, the disclosures of which are incorporated herein by references in their entireties.

BACKGROUND

1. Field

Apparatuses and methods consistent with the exemplary embodiments relate to a light emitting diode apparatus (LED) apparatus and a method of manufacturing the LED apparatus, and more particularly, to an LED apparatus that emits a red, green blue lights and may be used as pixels, and a method of manufacturing the LED apparatus.

2. Description of the Related Art

When using a light emitting diode (LED) of the related art in a display, three LEDs including red (R), green (G) and blue (B), respectively, are used to create one pixel. Here, the three LEDs are manufactured in different ways. Because the three LEDs are manufactured separately and combined into one LED thereafter, many related processes are involved in manufacturing the LED, and a number of color deviations are likely to occur due to manufacturing temperature and environment.

Further, a red LED and a green LED are manufactured by combining with a glass package including a blue LED and a Quantum Dot corresponding to each of the red and the green. That is, the red LED and the green LED are manufactured by covering Quantum Dot with glass and sealing the same, and the Quantum Dot coverts a wave of a blue light emitted from a lower portion to respectively express red color and green color. Here, the LED is bonded on top of a substrate and connected with an electrode via gold wire and covers the peripheral area with a plastic mold.

The manufacturing process includes separating an LED manufactured as an array of LEDs on a single wafer one by one to bond the LEDs on top of a PCB connected with a structure covered with a plastic mold, connecting + and − electrodes of each to a pad using a gold wire, and on top of it, adhering it with a glass package including a Quantum Dot.

When a Quantum Dot is adhered on top of an LED as such, the Quantum Dot which is vulnerable to heat is heated, thus deteriorating optical conversion characteristics dramatically. Further, a process of manufacturing, separating and packaging an LED in each of wavers is required, thus complicating the process and increasing costs for raw material.

Accordingly, there is a need for an LED which may perform sealing for the purpose of improving heat-proof performance to reduce complexity of process occurring in a LED packaging process of the related art and for the purpose of blocking oxygen and moisture.

SUMMARY

One or more exemplary embodiments provide an LED apparatus that emits red, green and blue lights and having a structure that is improved in terms of heat sink performance and manufacturing process, and a manufacturing method thereof.

According to an aspect of an exemplary embodiment, there is provided an LED apparatus including a plurality of substrate layers, each substrate layer of the plurality of substrate layers corresponding to one of a plurality of sub-pixels of a pixel; a heat sink plate provided on a first side of the plurality of substrate layers, the heat sink plate including a patterned area provided between adjacent substrate layers of the plurality of substrates layers; a fluorescence provided on the heat sink plate overlapping at least a portion of one of the plurality of substrate layers; and a plurality of light emitting diodes, each light emitting diode of the plurality of light emitting diodes being provided on a second side opposite to the first side of each substrate layer.

The patterned area of the heat sink plate may be configured to prevent lights emitted from the plurality of light emitting diodes and passing through the plurality of substrate layers from mixing with one another.

The fluorescence may include: a first fluorescence which is provided on a first side of a first substrate layer of the plurality of substrate layers, the first substrate layer corresponding to an R sub-pixel of the pixel; and a second fluorescence which is provided on a first side of a second substrate layer of the plurality of substrate layers, the second substrate layer corresponding to a G sub-pixel of the pixel.

The apparatus may further include a black sealant provided on the patterned area of the heat sink plate, wherein the first fluorescence and the second fluorescence are provided between the black sealant.

The apparatus may further include a glass layer provided on the black sealant and the fluorescence, wherein the black sealant seals an area between the heat sink plate and the glass layer.

The fluorescence may be configured to convert a light incident from the at least the portion of one of the plurality of substrate layers into a wave of a corresponding sub-pixel, and to emit the converted light outside by diffusing the light.

The apparatus may further include a color filter layer provided on the fluorescence and overlapping at least one sub-pixel of the pixel.

The apparatus may further include a metallic material provided on a side surface of each substrate layer and configured to reflect a light emitted to the side surface of each of the plurality of substrate layers back into each substrate layer.

The apparatus may further include a plurality of pads provided on each of the plurality of light emitting diodes and configured to receive an external power.

The plurality of substrate layers may include at least one of a plurality of sapphire substrate layers and a plurality of silicon substrate layers.

The heat sink plate may include a transparent heat sink plate.

The heat sink plate may include a single heat sink plate.

Accordingly to an aspect of another exemplary embodiment, there is a method for manufacturing an LED apparatus, the method including: forming a light emitting diode layer on a first side of a substrate; stacking a heat sink plate on a second side of the substrate opposite to the first side of the substrate, the heat sink plate including a patterned area; etching the substrate and the light emitting diode layer according to the patterned area of the heat sink plate thereby forming a plurality of substrate layers on the second side of the heat sink plate and a plurality of light emitting diodes on the first side of each substrate layer of the plurality of substrate layers; and stacking a fluorescence on the heat sink plate to overlap at least a portion of one of the plurality of substrate layers.

The patterned area of the heat sink plate may be configured to prevent lights emitted from the plurality of light emitting diodes and passing through each of the plurality of substrate layers from being mixed with one another, the patterned area of the heat sink plate being provided between adjacent substrate layers of the plurality of substrate layers.

The stacking the fluorescence may include stacking a first fluorescence on a first side of a first substrate layer of the plurality of substrate layers, the first substrate layer corresponding to an R sub-pixel of the pixel and stacking a second fluorescence in an upper portion of a substrate layer of the plurality of substrate layers, the second substrate layer corresponding to a G sub-pixel of the pixel.

The method may further include: forming a black sealant on at least a portion of the patterned area of the heat sink plate, and wherein the first fluorescence and the second fluorescence are provided between the black sealant.

The method may further include: forming a glass layer on the black sealant and the fluorescence; and radiating ultraviolet rays (UV) on the glass layer thereby hardening the black sealant, wherein the black sealant is configured to seal an area between the heat sink plate and the glass layer.

The fluorescence may be configured to convert a light incident from the at least the portion of one of the plurality of substrate layers into a wave of a corresponding sub-pixel, and to emit the converted light by diffusing the light.

The method may further include stacking a color filter layer on the fluorescence to overlap at least one sub-pixel of the pixel.

The method may further include providing a metallic material on a side surface of each of the plurality of substrate layers, wherein the metallic material is configured to reflect a light emitted to the side surface of each of the plurality of substrate layers back into an interior of each of the plurality of substrate layers.

The method may further include forming a plurality of pads on each of the plurality of light emitting diodes to receive an external power.

The heat sink plate may be patterned in a matrix form according to an array of a plurality of pixels.

The method may further include etching the substrate and the light emitting diode layer and then applying a stretching process to the heat sink plate.

According to an aspect of another exemplary embodiment, there is provided an LED apparatus including: a plurality of substrate layers, each substrate layer corresponding to one of a plurality of sub-pixels of a pixel; a heat sink plate stacked on a first side of each substrate layer, the heat sink plate including a patterned area provided between adjacent substrate layers of the plurality of substrates layers; a fluorescence stacked on the heat sink plate overlapping at least a portion of one of the plurality of substrate layers; and a plurality of light emitting diodes, each light emitting diode formed on a second side opposite to the first side of each substrate layer.

The patterned area of the heat sink plate may be configured to prevent lights emitted from the plurality of light emitting diodes and passing through the plurality of substrate layers from mixed with one another.

The fluorescence may include: a first fluorescence which is stacked on a first side of a first substrate layer of the plurality of substrate layers, the first substrate layer corresponding to an R sub-pixel of the pixel; and a second fluorescence which is stacked on a first side of a second substrate layer of the plurality of substrate layers, the second substrate layer corresponding to a G sub-pixel of the pixel.

The apparatus may further include a black sealant provided on the patterned area of the heat sink plate, wherein the first fluorescence and the second fluorescence may be provided between the black sealant.

The apparatus may further include a glass layer stacked on the black sealant and the fluorescence, wherein the black sealant may be configured to seal an area between the heat sink plate and the glass layer.

The fluorescence may be configured to convert a light incident from the at least the portion of one of the plurality of substrate layers into a wave of a corresponding sub-pixel and configured to emit the converted light outside by diffusing the light.

The apparatus may further include a color filter layer stacked on the fluorescence and overlapping at least one sub-pixel of the pixel.

The apparatus may further include a metallic material provided on a side surface of each substrate layer and configured to reflect a light emitted to the side surface of each of the plurality of substrate layers back into each substrate layer.

The apparatus may further include a plurality of pads formed on each of the plurality of light emitting diodes and configured to receive an external power.

The plurality of substrate layers may include a plurality of substrate layers.

The heat sink plate may include a transparent heat sink plate.

The heat sink plate may include a single heat sink plate.

According to an aspect of another exemplary embodiment, there is provided a method for manufacturing an LED apparatus including: forming a light emitting diode layer on a first side of a substrate; stacking a heat sink plate on a second side opposite to the first side of the substrate, the heat sink plate including a patterned area; etching the substrate and the light emitting diode layer according to the patterned area of the heat sink plate thereby forming a plurality of substrate layers on the second side of the heat sink plate and a plurality of light emitting diodes on the first side of each of the plurality of substrate layers; and stacking a fluorescence on the heat sink plate to overlap at least a portion of one of the plurality of substrate layers.

The patterned area of the heat sink plate may be configured to prevent lights emitted from the plurality of light emitting diodes and passing through each of the plurality of substrate layers from being mixed with one another, the patterned area of the heat sink plate being provided between adjacent substrate layers of the plurality of substrate layers.

The stacking the fluorescence may include stacking a first fluorescence on a first side of a first substrate layer of the plurality of substrate layers, the first substrate layer corresponding to an R sub-pixel of the pixel and stacking a second fluorescence in an upper portion of a substrate layer of the plurality of substrate layers, the second substrate layer corresponding to a G sub-pixel of the pixel.

The method may further include forming a black sealant on at least a portion of the patterned area of the heat sink plate, and the first fluorescence and the second fluorescence may be provided between the black sealant.

The method may further include: forming a glass layer on the black sealant and the fluorescence; and radiating ultraviolet rays (UV) on the glass layer thereby hardening the black sealant, wherein the black sealant is configured to seal an area between the heat sink plate and the glass layer.

The fluorescence may be configured to convert a light incident from the at least portion of one of the plurality of substrate layers into a wave of a corresponding sub-pixel, and configured to emit the converted light by diffusing the light.

The method may further include stacking a color filter layer on the fluorescence to overlap at least one sub-pixel of the pixel.

The method may further include providing a metallic material on a side surface of each of the plurality of substrate layers, and the metallic material may be configured to reflect a light emitted to the side surface of each of the plurality of substrate layers back into an interior of each of the plurality of substrate layers.

The method may further include forming a plurality of pads on each of the plurality of light emitting diodes to receive an external power.

The heat sink plate may be patterned in a matrix form according to an array of a plurality of pixels.

The method may further include etching the substrate and the light emitting diode layer and then applying a stretching process to the heat sink plate.

According to an aspect of another exemplary embodiment, there is provided a light emitting diode (LED) apparatus including: a plurality of substrate layers including: a first substrate layer corresponding to one of a R sub-pixel, a G sub-pixel and a B subpixel; a second substrate layer corresponding to one of a R sub-pixel, a G sub-pixel and a B subpixel; and a third substrate layer corresponding to one of a R sub-pixel, a G sub-pixel and a B subpixel, the first, second and third substrate layers corresponding to a sub-pixel different from one another; a single heat sink plate stacked on a first side of each of the first, second and third substrate layers, the heat sink plate including a patterned area corresponding to an area between adjacent substrate layers of the plurality of substrates layers; a fluorescence stacked on the heat sink plate overlapping at least a portion of one of the plurality of substrate layers, the fluorescence including: a first fluorescence overlapping at least a portion of the first substrate layer; and a second fluorescence overlapping at least a portion of the second substrate layer; and a plurality of light emitting diodes, each light emitting diode provided on a second side opposite to the first side of each of the first, second and third substrate layers.

The plurality of light emitting diodes may be configured to emit an identical color light toward the first, second and third substrate layers, and the first and second fluorescence may be configured to convert a light incident from the first and second substrate layers to a wave of a corresponding sub-pixel.

The patterned area of the heat sink plate may be patterned in black and configured to prevent lights emitted from the plurality of light emitting diodes and passing through the plurality of substrate layers from mixed with one another.

The apparatus may further include a black sealant stacked on the patterned area of the heat sink plate, and the patterned area and the black sealant are configured to prevent lights emitted from the plurality of light emitting diodes and passing through the plurality of substrate layers from mixed with one another.

According to the various exemplary embodiments of the present disclosure, a heat sink performance may be enhanced to extend life of an apparatus even if a size of an LED apparatus is reduced, thereby reducing time to manufacture the apparatus.

BRIEF DESCRIPTION OF THE DRAWINGS

The above and/or other aspects of one or more exemplary embodiments will become more apparent by reference to specific embodiments thereof which are illustrated in the appended drawings. Understanding that these drawings depict only exemplary embodiments of the disclosure and are not therefore to be considered to be limiting of the scope of the disclosure, the principles herein are described and explained with additional specificity and detail through the use of the accompanying drawings, in which.

DETAILED DESCRIPTION

Figure 1:
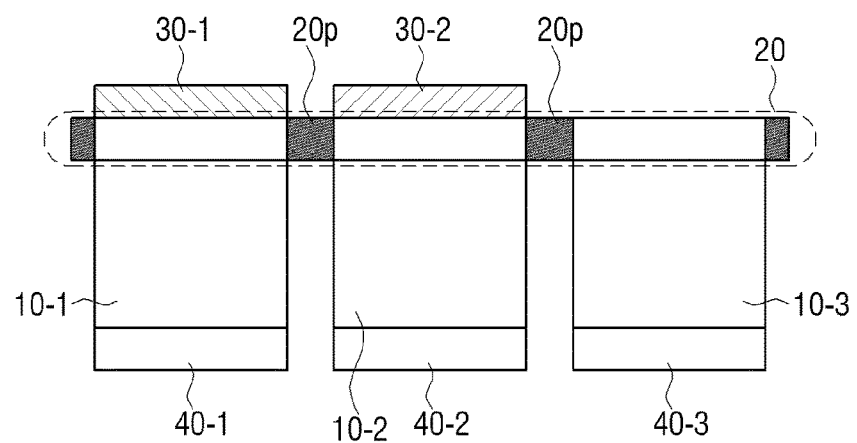
FIG. 1 is a diagram to illustrate an LED apparatus according to an exemplary embodiment.

The exemplary embodiments of the present disclosure may be diversely modified. Accordingly, specific exemplary embodiments are illustrated in the drawings and are described in detail in the detailed description. However, it is to be understood that the present disclosure is not limited to a specific exemplary embodiment, but includes all modifications, equivalents, and substitutions without departing from the scope and spirit of the present disclosure. Also, well-known functions or constructions are not described in detail since they would obscure the disclosure with unnecessary detail.

If it is described that a certain element (e.g., first element) is "operatively or communicatively coupled with/to" or is "connected to" another element (e.g., second element), it should be understood that the certain element may be connected to the other element directly or through still another element (e.g., third element). If it is described that a certain element (e.g., first element) is "directly coupled to" or "directly connected to" another element (e.g., second element), it may be understood that still another element (e.g., third element) does not exist between the certain element and the other element.

The terms used in various exemplary embodiments of the present disclosure are for the purpose of describing particular exemplary embodiments and are not intended to limit the present disclosure. Singular forms are intended to include plural forms unless the context clearly indicates otherwise. Unless otherwise defined, all terms used herein have the same meaning as commonly understood by one of ordinary skill in the art to which this inventive concept belongs. The terms defined in a generally used dictionary should be interpreted as having the same meanings as the contextual meanings of the relevant technology and should not be interpreted as having ideal or exaggerated meanings unless they are clearly defined in the various exemplary embodiments of the present disclosure. According to circumstances, even the terms defined in the exemplary embodiments of the present disclosure should not be interpreted as excluding the exemplary embodiments of the present disclosure.

Hereinafter, various exemplary embodiments of the present disclosure will be described in detail with reference to the accompanying drawings.

FIG. 1 is a diagram to illustrate a light emitting diode (LED) apparatus 1000, according to an exemplary embodiment. Referring to FIG. 1, the LED apparatus 1000 includes a plurality of sapphire substrate layers (e.g., a first sapphire substrate layer, a second sapphire substrate layer and a third sapphire substrate layer) 10-1, 10-2, 10-3, a transparent heat sink plate 20, a fluorescence (e.g., a first fluorescence and a second fluorescence) 30-1, 30-2, and a plurality of light emitting diodes (e.g., a first light emitting diode, a second light emitting and a third light emitting) 40-1, 40-2, 40-3.

In the exemplary embodiment, the transparent heat sink plate 20 is mounted on the plurality of sapphire substrate layers 10-1, 10-2, 10-3, however, the exemplary embodiment is not limited thereto and a semiconductor substrate (not shown) may also be mounted on an upper portion (e.g., a top surface) of the plurality of sapphire substrate layers 10-1, 10-2, 10-3. For example, a nitride layer (an example of a semiconductor substrate) having a hexagonal crystal system may be mounted on a sapphire substrate layer.

A sapphire substrate layer of the plurality of sapphire substrate layers 10-1, 10-2, 10-3 may correspond to a plurality of sub-pixels of a pixel, respectively. For example, a first sapphire substrate layer 10-1 may correspond to an R (red) sub-pixel, and a second sapphire substrate layer 10-2 may correspond to a G (green) sub-pixel, and a third sapphire substrate layer 10-3 may correspond to a B (blue) sub-pixel.

However, the plurality of sapphire substrate layers 10-1, 10-2, 10-3 have the same structural configurations, and may be used as a path through which light passes. Further, lights that pass the plurality of sapphire substrate layers 10-1, 10-2, 10-3 have the same characteristics, and features of each sub-pixel of the R, G and B sub-pixels may be distinguished by a respective fluorescence 30-1, 30-2 provided on each of the plurality of sapphire substrate layers 10-1, 10-2, 10-3.

Each of the plurality of sapphire substrates 10-1, 10-2, 10-3 may function as a light guide plate which guides light generated from the plurality of light emitting diodes 40-1, 40-2, 40-3 provided on a lower portion (e.g., a bottom surface) thereof. That is, light generated from the plurality of light emitting diodes 40-1, 40-2, 40-3 may be incident to a lower portion (a bottom surface) of the plurality of sapphire substrate layers 10-1, 10-2, 10-3 corresponding to each of the plurality of light emitting diodes 40-1, 40-2, 40-3 and emitted from upper portions of the plurality of sapphire substrate layers 10-1, 10-2, 10-3, and only a portion of the light generated from the plurality of light emitting diodes 40-1, 40-2, 40-3 may be emitted from a side surface of each of the plurality of sapphire substrate layers 10-1, 10-2, 10-3.

However, as to be explained below, a metallic material may be coated on the side surface of each of the plurality of sapphire substrate layers 10-1, 10-2, 10-3. Here, light emitted from sides of each of the plurality of sapphire substrate layers 10-1, 10-2, 10-3 may be reflected back into an interior of each of the plurality of sapphire substrate layers 10-1, 10-2, 10-3 by the metallic material.

In the exemplary embodiment, the plurality of sapphire substrate layers 10-1, 10-2, 10-3 are used; however, this is merely an example. For example, the LED apparatus 1000 may include a plurality of silicon layers instead of the plurality of sapphire substrate layers 10-1, 10-2, 10-3 as well.

The transparent heat sink plate 20 is stacked on upper portions of the plurality of sapphire substrate layers 10-1, 10-2, 10-3 as shown in FIG. 1, and an area between adjacent sapphire substrate layers of the plurality of sapphire substrate layers 10-1, 10-2, 10-3 is patterned. That is, the heat sink plate 20 includes a patterned area 20p provided between adjacent substrate layers of the plurality of substrates layers as shown in FIG. 1.

The transparent heat sink plate 20 may be patterned (i.e., the patterned area 20p) in a matrix form according to an array of a plurality of pixels. For example, the transparent heat sink plate 20 may be patterned in a matrix form that corresponds to 1920×1080×3=6,220,800, to realize a full high definition (FHD) display. Although a portion of the transparent heat sink plate 20 corresponding to a sub-pixel may be transparent, a portion that does not correspond to the sub-pixel may be black-patterned (or be patterned in black).

The transparent heat sink plate 20 may prevent lights emitted from the plurality of light emitting diodes and passing through the plurality of sapphire substrate layers 10-1, 10-2, 10-3, respectively, from being mixed with one another by black-patterning an area (the patterned area 20p) between adjacent sapphire substrate layers of the plurality of sapphire substrate layers 10-1, 10-2, 10-3.

The transparent heat sink plate 20 may block heat generated from the plurality of light emitting diodes 40-1, 40-2, 40-3 from being transferred to the fluorescence 30-1, 30-2. For example, the transparent heat sink plate 20 may be made with silicon, etc. Thereby, the product life of the fluorescence 30-1, 30-2 may be extended.

Further, the transparent heat sink plate 20 is extendable by applying an etching process. The detailed explanation will be provided below. The etching process to thin the transparent heat sink plate 20 will be described in detail by the description of FIGS. 12A and 12B below.

The fluorescence 30-1, 30-2 is a type of a light emitting material, which absorbs energy to emit red, green or blue light, etc. For example, it may be quantum dots, etc. The fluorescence may be stacked on an upper portion (e.g., a top surface or a first surface) of the transparent heat sink plate 20 over at least a portion of the plurality of sapphire substrate layers 10-1, 10-2, 10-3. For example, the fluorescence 30-1, 30-2 is stacked on an upper portion of the transparent heat sink plate 20 of the plurality of sapphire substrate layers 10-1, 10-2, but may not be stacked on an upper portion of the transparent heat sink plate 20 of the sapphire substrate layer 10-3.

When the fluorescence 30-1, 30-2 is stacked, features of the plurality of sapphire substrate layers 10-1, 10-2, 10-3 are differentiated. For example, the plurality of light emitting diodes may emit blue light in the same manner, and a fluorescence 30-1, 30-2 is stacked in an upper portion of the transparent heat sink plate 20 of the first sapphire substrate layer 10-1 and the second sapphire substrate layer 10-2 function as an R sub-pixel and a G-sub-pixel, respectively. In this example, the third sapphire substrate layer 10-3 in which the fluorescence 30-1, 30-2 is not stacked may function as a B (blue) sub-pixel.

In the exemplary embodiment, the fluorescence 30-1, 30-2 may include a first fluorescence 30-1 which is stacked on an upper portion of the first sapphire substrate layer 10-1 corresponding to an R sub-pixel from among the plurality of sapphire substrate layers 10-1, 10-2, 10-3 and a second fluorescence 30-2 which is stacked on an upper portion of the second sapphire substrate layer 10-2 corresponding to a G sub-pixel from among the plurality of sapphire substrate layers 10-1, 10-2, 10-3. However, this is merely an exemplary embodiment, and the fluorescence 30-1, 30-2 may include other types of fluorescence as well.

As described above, the plurality of sapphire substrate layers 10-1, 10-2, 10-3 may function as a light guide plate which collects light incident from the plurality of light emitting diodes 40-1, 40-2, 40-3 and emits the light, and thereby a viewing angle may be narrowed. Accordingly, the fluorescence 30-1, 30-2 may convert light incident from the plurality of sapphire substrate layers 10-1, 10-2, 10-3 to a wave of a corresponding pixel, and may diffuse the converted light to outside through an internal diffuser and emit the light. That is, a viewing angle may be widened by a diffuser included in the fluorescence 30-1, 30-2.

However, this is merely an exemplary embodiment, and the fluorescence 30-1, 30-2 may not include a diffuser to narrow a viewing angle. For example, in the case of a display to be used in public places, preventing exposure of personal information may be a more important factor rather than a viewing angle, and in this case, a diffuser may not be used.

The plurality of light emitting diodes 40-1, 40-2, 40-3 may correspond to a p-n junction diode which emits light by recoupling a pair of excessive electron-holes. The plurality of light emitting diodes 40-1, 40-2, 40-3 may emit light by recoupling an electron included in an n-type semiconductor layer with a hole of a p-type semiconductor layer when a voltage is applied.

The plurality of light emitting diodes 40-1, 40-2, 40-3 may be formed (or provided) on a lower portion (e.g., a bottom surface or a second surface) of each of the plurality of sapphire substrate layers 10-1, 10-2, 10-3. The plurality of light emitting diodes 40-1, 40-2, 40-3 may emit light when a voltage is applied thereto, and the emitted light passes through the corresponding plurality of sapphire substrate layers 10-1, 10-2, 10-3 and fluorescence 30-1, 30-2, etc. In the exemplary embodiment described below, it will be described as the plurality of light emitting diodes 40-1, 40-2, 40-3 emit a blue light. However, this is merely an examplary embodiment, and the plurality of light emitting diodes 40-1, 40-2, 40-3 may emit light in different colors. Here, a type of fluorescence 30-1, 30-2 may vary according to a color of light emitted by the plurality of light emitting diodes 40-1, 40-2, 40-3.

Figure 2:
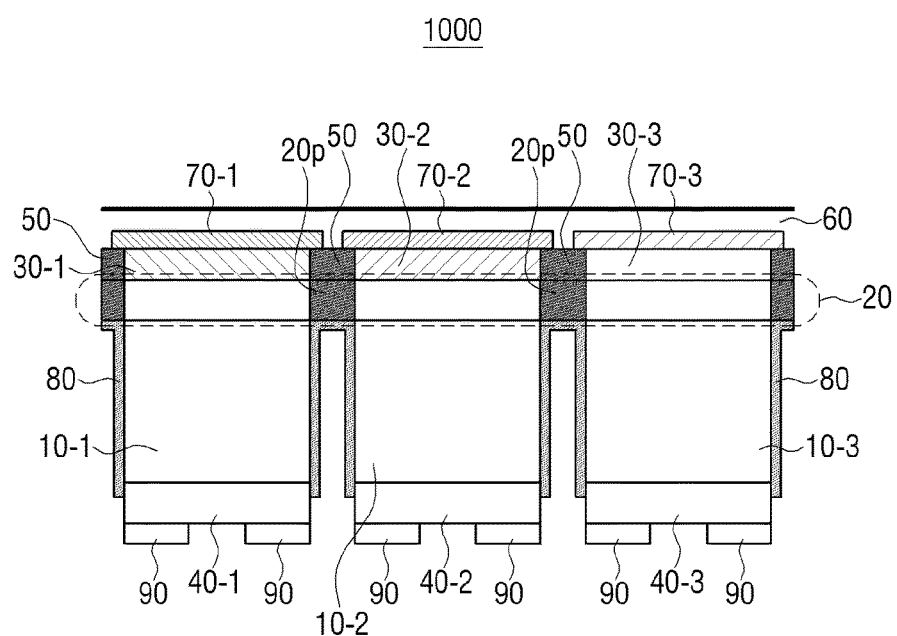
FIG. 2 illustrates a detailed configuration of the LED apparatus illustrated in FIG. 1.

FIG. 2 illustrates a detailed configuration of the LED apparatus 1000 illustrated in FIG. 1. The elements of FIG. 2 being identical with the elements of FIG. 1 will not be specifically explained below.

The LED apparatus 1000 may further include a black sealant 50, a glass layer 60, a color filter layer (a first color filter layer, a second color filter layer and a third color filter layer) 70-1, 70-2, 70-3, a metallic material 80, and a plurality of pads 90, in addition to the elements of FIG. 1.

The black sealant 50 may be made with a material to join a glass layer 60, and the black sealant 50 may be stacked on an upper portion (e.g., a top surface) of a black-patterned area of the transparent heat sink plate 20. That is, the black sealant 50 is stacked on an area provided between adjacent sapphire substrate layers of the plurality of sapphire substrate layers 10-1, 10-2, 10-3.

Further, the black sealant 50 controls light emitted from the plurality of light emitting diodes 40-1, 40-2, 40-3 the same way as the patterned area of the transparent heat sink plate 20. That is, the black sealant 50 may prevent lights passing through each of the plurality of sapphire substrate layers 10-1, 10-2, 10-3 from being mixed with one another.

The above-described fluorescence 30-1, 30-2 may be formed between the black sealant 50. That is, a first fluorescence 30-1 and a second fluorescence 30-2 may be formed between the black sealant 50 formed on an upper portion (e.g., a top surface) of a black-patterned area of the transparent heat sink plate 20.

The glass layer 60 may be formed on upper portions of the black sealant 50 and the fluorescence 30-1, 30-2. The black sealant 50 may seal an area between the transparent heat sink plate 20 and the glass layer 60.

The glass layer 60 may protect the fluorescence 30-1, 30-2 from oxygen, moisture, etc. The glass layer 60 made with a glass material is merely an example, and polyimide, PET, etc. may be used instead of a glass material.

A color filter layer 70-1, 70-2, 70-3 may be stacked over at least one sub-pixel on an upper portion of fluorescence 30-1, 30-2. The color filter layer 70-1, 70-2, 70-3 may include a first filter layer 70-1 which only allows light having a red wave to pass through an upper portion of a first fluorescence 30-1 corresponding to an R sub-pixel and a second color filter layer 70-2 which only allows light having a green wave to pass through an upper portion of a second fluorescence 30-2 corresponding to a G sub-pixel.

Further, a third color filter layer 70-3 may be used even when a fluorescence is not stacked over a third sapphire substrate layer 10-3 on the transparent heat sink plate 20. For example, the color filter layer 70-3 may be spaced apart from an upper portion of a third sapphire substrate layer 10-3 corresponding to a B sub-pixel and stacked. The color filter layer 70-3 may only allow light having a blue wave to pass through, and a space between the sapphire substrate layer 10-3 and the color filter layer 70-3 may be empty.

The third color filter layer 70-3 may be a narrow band color filter, and may increase color purity without any optical loss.

When no voltage is applied to the plurality of light emitting diodes 40-1, 40-2, 40-3, each sub-pixel should look black, but each sub-pixel may look gray because light is incident from an external source and reflected again.

The color filter layer 70-1, 70-2, 70-3 may filter light incident from an external source and filter light reflected again to control each sub-pixel to look black when no voltage is applied to the plurality of light emitting diodes 40-1, 40-2, 40-3. That is, when the color filter layer 70-1, 70-2, 70-3 does not exist, a pixel may look brighter than when the color filter layer 70-1, 70-2, 70-3 exists.

The metallic material may be coated to surround a side surface of each of the plurality of sapphire substrate layers 10-1, 10-2, 10-3 to reflect light emitted to the side surface of the plurality of sapphire substrate layers 10-1, 10-2, 10-3 back to an interior of the plurality of sapphire substrate layers 10-1, 10-2, 10-3.

That is, the metallic material 80 may control to prevent lights between adjacent sub-pixels from being mixed with each other, and may increase brightness of pixels.

The metallic material 80 may be realized as aluminum, moly, titanium, and etc. However, the exemplary embodiment is not limited thereto, and the metallic material 80 may be any substance that can reflect light.

A plurality of pads 90 may be formed on a lower portion (e.g., a bottom surface) of each of the plurality of light emitting diodes 40-1, 40-2, 40-3 to receive external power. The plurality of pads 90 may receive external power to apply voltage to each of the plurality of light emitting diodes 40-1, 40-2, 40-3.

Each of the plurality of pads 90 may be connected to each of a p-type semiconductor layer and a n-type semiconductor layer of a light emitting diode to apply voltage.

The LED apparatus 1000 having the above-described structure may remove a substrate, mold, gold wire, etc., thereby reducing costs and improving efficiency by a metallic material 80. Further, the LED apparatus 1000 having the above-described structure may be reduced in size while improving heating performance and improving product life of the apparatus.

A manufacturing method of the present LED apparatus 100 will be described below.

The terms "deposit," "mount," and "stack" used below are used to refer to forming a layer of semiconductor substance, and a layer or thin film formed through various exemplary embodiments of the present disclosure may be mounted within a chamber for mounting using a metal-organic chemical vapor deposition (MOCVD) or a molecular beam epitaxy (MBE), and may be formed by performing deposition using various methods such as PECVD, APCVD, LVCVD, UHCVD, PVD, electronic beam method, a resistance heating method, etc.

Figure 3:
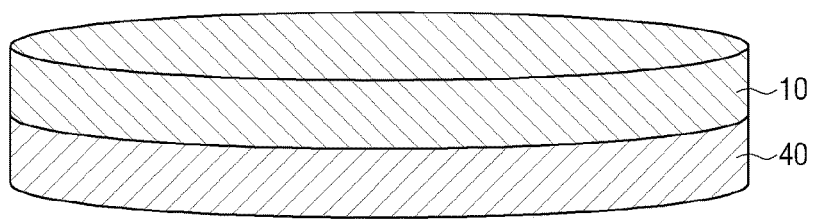
FIGS. 3 to 11 illustrate a method for manufacturing an LED apparatus, according to an exemplary embodiment.

Referring to FIG. 3, first, a light emitting diode layer 40 is formed on a lower portion (e.g., a bottom surface) of a sapphire substrate layer 10. However, in the actual manufacturing process, a light emitting diode layer 40 may be formed on an upper portion (e.g., a top surface) of the sapphire substrate layer 10. Although it is illustrated in FIG. 3 that a p-type semiconductor layer and a n-type semiconductor layer may be interchangeably used, in the actual manufacturing process, the two layers may be formed sequentially. However, the order of stacking the p-type semiconductor layer and the n-type semiconductor layer are not relevant to the present disclosure, and it does not matter which layer is stacked on top of the other.

A GaN layer (not shown) may be mounted on a upper portion (e.g., a top surface) of the sapphire substrate layer 10 to form a light emitting diode layer 40. In the exemplary embodiment, the light emitting diode layer 40 may emit blue light. However, the exemplary embodiment is not limited thereto, and the light emitting diode layer 40 may be formed with any material that may form the light emitting diode layer 40.

Figure 4A:
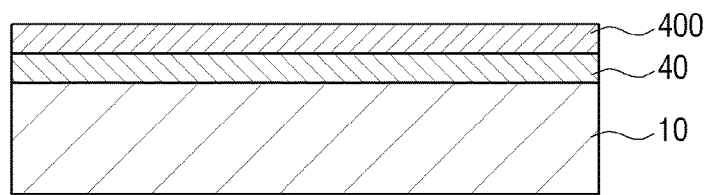
Figure 4B:
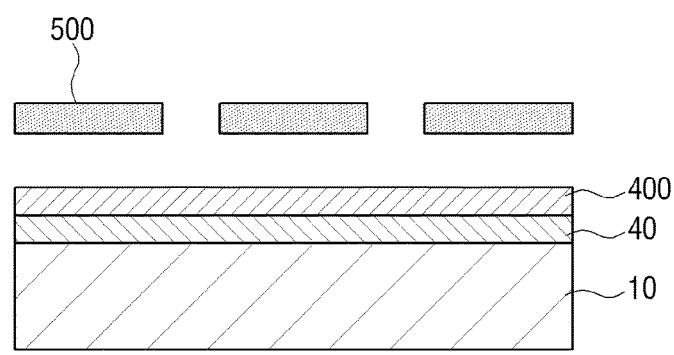
Figure 4C:
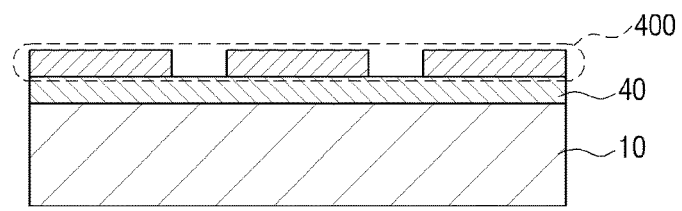

The below FIGS. 4A to 4C are views illustrating a method for applying a photo resistor for etching the sapphire substrate layer 10 and the light emitting diode layer 40. FIGS. 4A to 4C illustrate an upside-down version of the sapphire substrate layer 10 and the light emitting diode layer 40 of FIG. 3 for the convenience of explanation.

First, as illustrated in FIG. 4A, a photo resistor 400 is applied on an upper portion of the light emitting diode layer 40. In the exemplary embodiment, the photo resistor 400 is applied for the purpose of exposure which will be described below.

Then, as illustrated in FIG. 4B, a mask 500 manufactured to correspond to a predetermined pixel is disposed in an upper portion of the photo resistor 400.

The mask 500 manufactured to correspond to the predetermined pixel is a mask 500 for removing the photo resistor 400 in an area that is not used as a sub-pixel. That is, the mask 500 may be manufactured to shield the photo resistor 400 in an area that is used as a sub-pixel from an exposure device.

As illustrated in FIG. 4C, when light is exposed to an exposure area of the photo resistor 400 through an exposure device, an area to be used as a pixel is a photo resistor 400. That is, a lower portion of a removed area of the photo resistor 400 is an area which is not used as a sub-pixel, and a lower portion of the remaining area of the photo resistor 400 is an area which is used as a sub-pixel.

For the manufacturing process after FIG. 5, an upside down version of a disposition of the sapphire substrate layer 10 and the light emitting diode layer 40 will be described as in FIG. 3.

Figure 5:
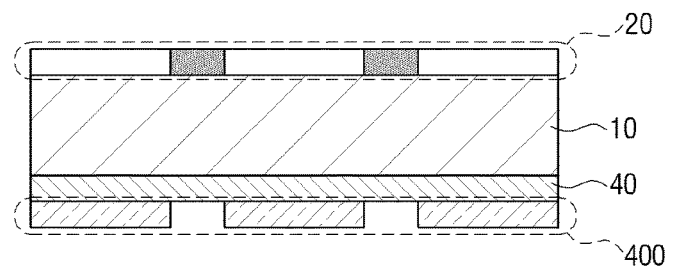

As illustrated in FIG. 5, a patterned transparent heat sink plate 20 may be stacked on an upper portion (a first side) of the sapphire substrate layer 10 after removing a portion of the photo resistor 400.

The transparent heat sink plate 20 may be patterned in a matrix form that corresponds to a plurality of pixels. For example, a portion which is used as a sub-pixel may be transparent, while a portion which is not used as a sub-pixel may be black-patterned. Further, a pattern of the transparent heat sink plate 20 may be identical to an area from which the photo resistor 400 is removed. However, the exemplary embodiment is not limited thereto. For example, a pattern of the transparent heat sink plate 20 may be different from an area from which the photo resistor 400 is removed.

Figure 6:
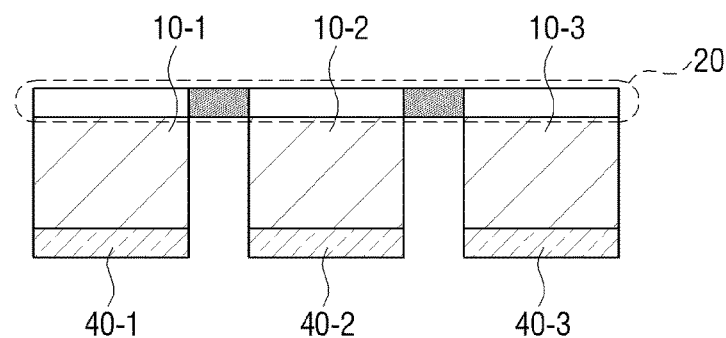

FIG. 6 illustrates etching the sapphire substrate layer 10 and the light emitting diode layer 40 to correspond to the pattern to form the plurality of sapphire substrate layers 10-1, 10-2, 10-3 in a lower portion of the transparent heat sink plate 20 and to form a plurality of light emitting diodes 40-1, 40-2, 40-3 in a lower portion of the respective plurality of sapphire substrate layers 10-1, 10-2, 10-3. The remaining photo resistor 400 is completely removed after etching the sapphire substrate layer 10 and the light emitting diode layer 40.

In the exemplary embodiment, when the transparent heat sink plate 20 is not used, the plurality of sapphire substrate layers 10-1, 10-2, 10-3 and the plurality of light emitting diodes 40-1, 40-2, 40-3 formed thereunder may be formed individually. In this case, in order to use the plurality of sapphire substrate layers 10-1, 10-2, 10-3 and the plurality of light emitting diodes 40-1, 40-2, 40-3 as a display, additional process to move the plurality of sapphire substrate layers 10-1, 10-2, 10-3 and the plurality of light emitting diodes 40-1, 40-2, 40-3 onto a new substrate is required.

That is, the transparent heat sink plate 20 is a configuration or an element which connects the plurality of sapphire substrate layers 10-1, 10-2, 10-3 with the plurality of light emitting diodes 40-1, 40-2, 40-3 formed thereunder after etching the sapphire substrate layer 10 and the light emitting diode layer 40. In the related art, a process of moving each sub-pixel onto a substrate is required; however, each sub-pixel may be used as a display as itself by using the transparent heat sink plate 20 without the moving process.

Further, the transparent heat sink plate 20 may be black-patterned to control light between sub-pixels are not mixed with each other. That is, the transparent heat sink plate 20 may include an area provided between adjacent sapphire substrate layers of the plurality of sapphire substrate layers 10-1, 10-2, 10-3 and being patterned in black such that a plurality of lights that are emitted from the plurality of light emitting diodes 40-1, 40-2, 40-3 and that pass through each of the plurality of sapphire substrate layers 10-1, 10-2, 10-3 are not mixed with one another.

An etching process may be applied to the transparent heat sink plate 20 to change a final resolution of a display. This etching process will be described with reference to FIGS. 12A and 12B.

Thereafter, a florescence 30-1, 30-2 may be stacked on an upper portion of the transparent heat sink plate 20 over at least a portion of the plurality of sapphire substrate layers 10-1, 10-2, 10-3 to overlap at least a portion of the plurality of sapphire substrate layers 10-1, 10-2, 10-3. Further, a fluorescence 30-1, 30-2 may be stacked after stacking the black sealant 50 on the black patterned area of the transparent heat sink plate 20. Hereinafter, it will be described such that the black sealant 50 is stacked on the transparent heat sink plate 20 before stacking the florescence 30-1, 30-2, but this is merely an example.

Figure 7:
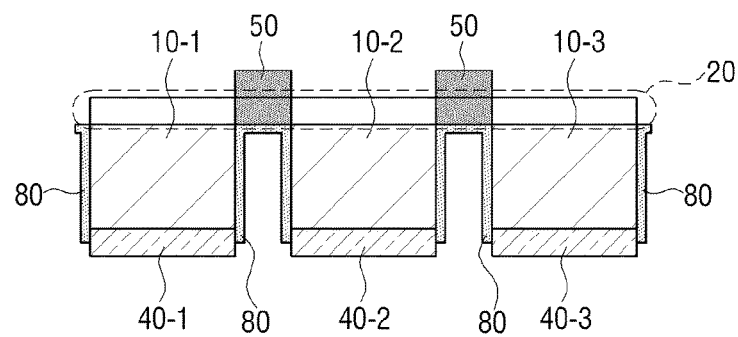

FIG. 7 illustrates that a metallic material 80 is coated to surround a side surface of each of the plurality of sapphire substrate layers 10-1, 10-2, 10-3. In the exemplary embodiment, the metallic material 80 may reflect light emitted to the side surface of each of the plurality of sapphire substrate layers 10-1, 10-2, 10-3 back to an interior of each of the plurality of sapphire substrate layers 10-1, 10-2, 10-3.

Further, the metallic material 80 may be coated to surround a portion of a side surface of each of the plurality of light emitting diodes 40-1, 40-2, 40-3, as well as a side surface of each of the plurality of sapphire substrate layers 10-1, 10-2, 10-3.

The metallic material 80 may prevent lights between sub-pixels from being mixed with each other, and may be made with aluminum, moly, titanium, etc.

Further, the metallic material 80 may be formed on a side surface of each of the plurality of sapphire substrate layers 10-1, 10-2, 10-3 through sputtering. In the exemplary embodiment, the sputtering is a type of vacuum deposition method, which generates plasma in a relatively low vacuum level, accelerates gas such as ionized argon, etc., make gas collide with a target, and spurts a target atom, to make a film onto a substrate nearby.

However, the exemplary embodiment is not limited thereto. Any method that may coat a side surface of each of the plurality of sapphire substrate layers 10-1, 10-2, 10-3 may be used.

The metallic material 80 may suppress light from emitting through a side surface of each of the plurality of sapphire substrate layers 10-1, 10-2, 10-3, thereby improving brightness of each sub-pixel.

Further, the black sealant 50 may be formed on an upper portion of the transparent heat sink plate 20 in which an area between the plurality of sapphire substrate layers 10-1, 10-2 10-3 is patterned in black.

The black sealant 50 controls light emitted from the plurality of light emitting diodes 40-1, 40-2, 40-3 the same way as the patterned area of the transparent heat sink plate 20. That is, the black sealant 50 may prevent lights passing through each of the plurality of sapphire substrate layers 10-1, 10-2, 10-3 from being mixed with one another.

It is described in FIG. 7 that the material 80 and the black sealant 50 are formed before the fluorescence 30-1, 30-2 is stacked. However, the exemplary embodiment is not limited thereto. For example, the fluorescence 30-1, 30-2 may be stacked first and then, the metallic material 80 and the black sealant 50 may be formed. Further, the black sealant 50 may be formed first and then, the metallic material 80 may be formed, or the black sealant 50 and the metallic material 80 may be formed simultaneously.

Figure 8:
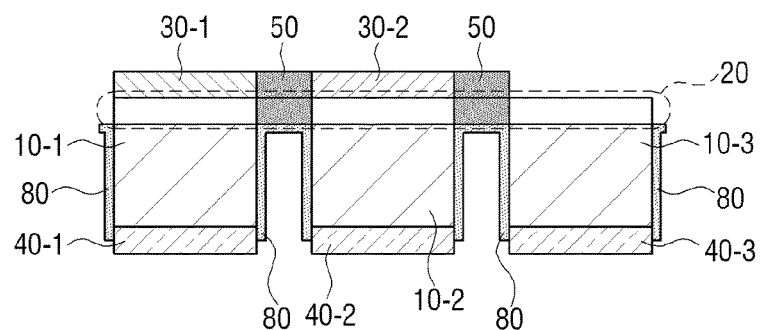

FIG. 8 illustrates that the fluorescence 30-1, 30-2 is stacked on an upper portion (e.g., a top surface) of the transparent heat sink plate 20 to overlap at least a portion of the plurality of sapphire substrate layers 10-1, 10-2, 10-3. Further, the fluorescence 30-1, 30-2 may be stacked between the black sealant 50.

The fluorescence 30-1, 30-2 may convert light incident from the plurality of sapphire substrate layers 10-1, 10-2, 10-3 to a wave of a corresponding pixel, and may diffuse the converted light outside through an internal diffuser to emit the light. For example, the fluorescence 30-1, 30-2 may convert a blue light into a red or green light and emit the converted light.

The fluorescence 30-1, 30-2 may include a first fluorescence 30-1 which emits a red light and a second fluorescence 30-2 which emits a green light. The first fluorescence 30-1 may be stacked on an upper portion of a first sapphire substrate layer 10-1 corresponding to an R sub-pixel from among the plurality of sapphire substrate layers 10-1, 10-2, 10-3, and the second fluorescence 30-2 may be stacked on an upper portion of a second sapphire substrate layer 10-2 corresponding to a G sub-pixel from among the plurality of sapphire substrate layers 10-1, 10-2, 10-3.

Further, the fluorescence may include a third fluorescence 30-3 which emits a blue light. In this example, the third fluorescence 30-3 may be stacked on an upper portion of a sapphire substrate layer 10-3 corresponding to a B sub-pixel from among the plurality of sapphire substrate layers 10-1, 10-2, 10-3. Specifically, the third fluorescence 30-3 may be used when a light emitted from the plurality of light emitting diodes 40-1, 40-2, 40-3 are not blue.

The first fluorescence 30-1 and the second fluorescence 30-2 may be formed between the black sealant 50.

Figure 9:
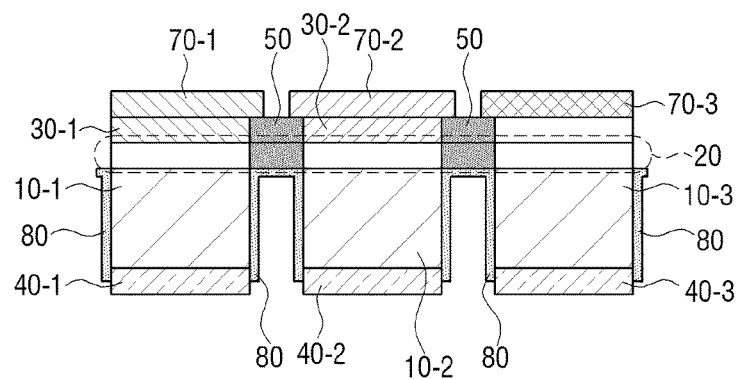

FIG. 9 illustrates that a color filter layer 70-1, 70-2, 70-3 are stacked to overlap a sub-pixel of the fluorescence 30-1, 30-2. As described above, the color filter layer 70-1, 70-2, 70-3 may only pass through a light of a wave corresponding to the color filter layer 70-1, 70-2, 70-3. Further, the color filter layer 70-1, 70-2, 70-3 may remove the effect such that a sub-pixel looks gray by means of a light incident from an external source and a reflected light.

It is illustrated in FIG. 9 that a color filter layer 70-3 is provided on an upper portion (e.g., a top surface or a first surface) of a third sapphire substrate layer 10-3 corresponding to a B sub-pixel, but the exemplary embodiment is not limited thereto. For example, the color filter layer 70-3 may not be used at all. Further, a user may not use any of the color filter layer 70-1, 70-2, 70-3.

Although it is illustrated in FIG. 9 that the color filter layer 70-1, 70-2, 70-3 is placed over a portion of the black sealant 50, the exemplary embodiment is not limited thereto. For example, the color filter layer 70-1, 70-2, 70-3 may be formed over an entire portion of the black sealant 50. Further, the color filter layer 70-1, 70-2, 70-3 may be formed between the black sealant 50 along with the fluorescence 30-1, 30-2. In this example, a thickness of fluorescence 30-1, 30-2 may be thinner than that of the black sealant 50.

Figure 10:
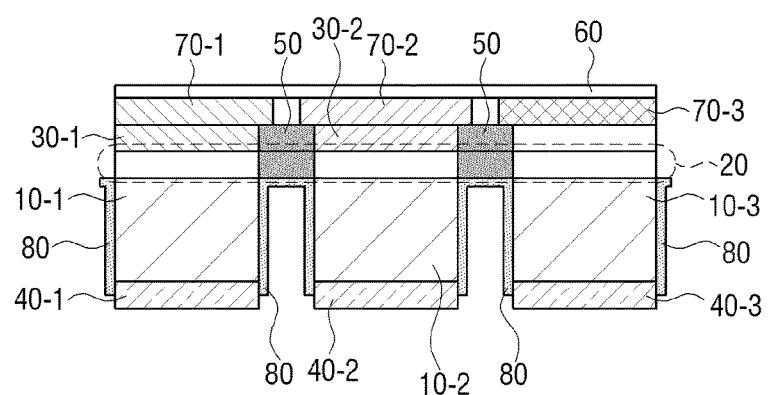

FIG. 10 illustrates that the glass layer 60 is formed on upper portions of the black sealant 50 and the color filter layer 70-1, 70-2, 70-3. In an exemplary embodiment where the color filter layer 70-1, 70-2, 70-3 is not used, the glass layer 60 may be formed on upper portions of the black sealant 50 and the fluorescence 30-1, 30-2.

Further, ultraviolet (UV) rays may be radiated onto the glass layer 60 to harden the black sealant 50. The black sealant 50 may seal an area between the transparent heat sink plate 20 and the glass layer 60.

Figure 11:
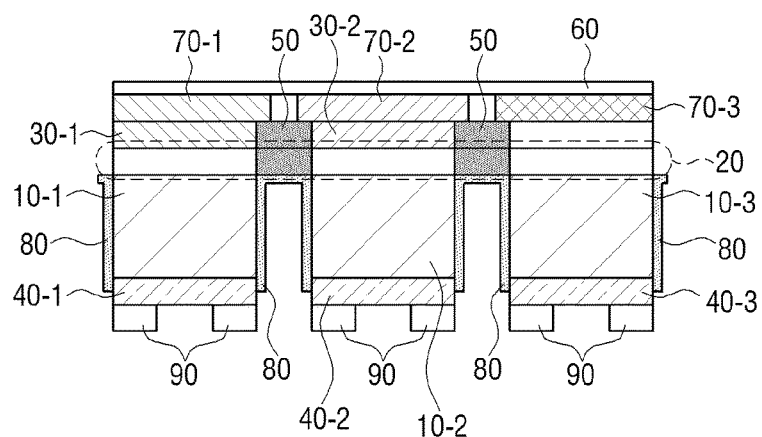

FIG. 11 illustrates that a plurality of pads 90 for receiving external power are formed on a lower portion (e.g., a bottom surface or a second surface) of each of the plurality of light emitting diodes 40-1, 40-2, 40-3. For example, two (2) pads may be formed on a lower portion of each of the plurality of light emitting diodes 40-1, 40-2, 40-3, and each of the two pads may be connected to a n-type semiconductor layer and a p-type semiconductor layer of the light emitting diodes, respectively. The two pads may apply power to the light emitting diodes, and in response, the light emitting diodes may emit light.

If the aforementioned manufacturing method is used, a process of the related art of removing and mounting each of the LEDs may be omitted, and an LED array may be used instead of a plurality of LEDs, and thus, the process is improved. Further, a limitation of a minimum clearance between parts according to a mounting process of the related art is removed, thereby enabling manufacturing of a high-resolution display.

Figure 12A:
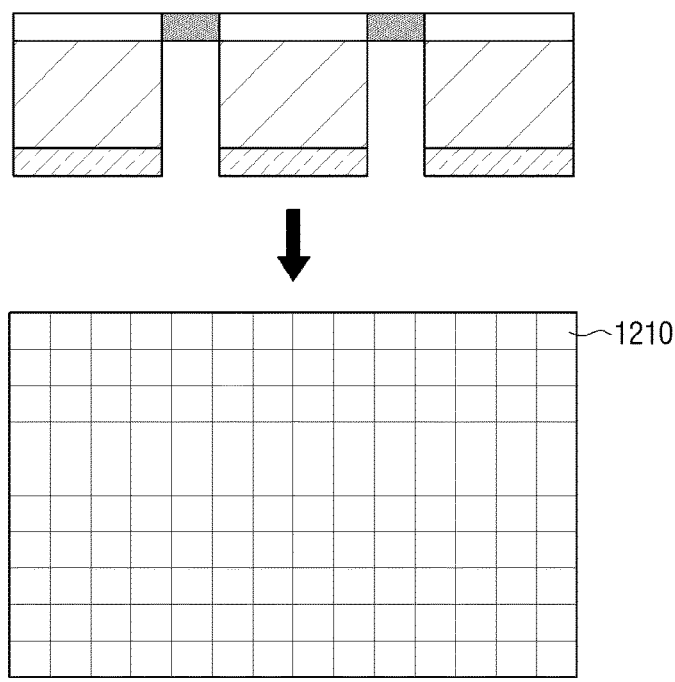
FIGS. 12A and 12B are views illustrating a stretching process, according to an exemplary embodiment.
Figure 12B:
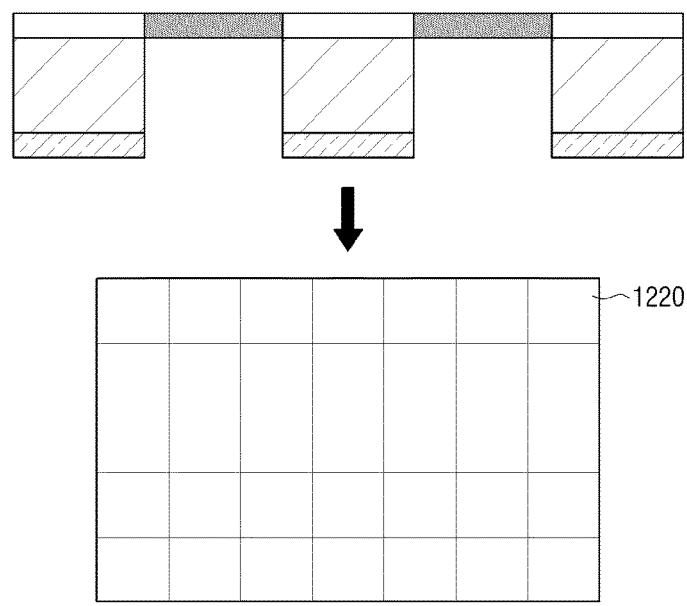

FIGS. 12A and 12B are views illustrating an etching process, according to an exemplary embodiment.

The etching process refers to a process of elongating raw material in a thinning manner. The etching process (the thinning process) may be applied to the transparent heat sink plate 20 after chemically etching a plurality of light emitting diodes 40-1, 40-2, 40-3 provided on the plurality of sapphire substrate layers 10-1, 10-2, 10-3 and each of the plurality of sapphire substrate layers 10-1, 10-2, 10-3 as described above.

If the etching process is applied to the transparent heat sink plate 20, a pattern area of the transparent heat sink plate 20 provided between adjacent sapphire substrate layers is elongated as illustrated in FIG. 12B. A portion that is not a pattern area of the transparent heat sink plate 20 is not elongated due to the plurality of sapphire substrate layers 10-1, 10-2, 10-3 and the plurality of light emitting diodes 40-1, 40-2, 40-3 being attached to the portion that is not a pattern area of the transparent heat sink plate 20.

Further, the transparent heat sink plate 20 may be elongated vertically or horizontally through the etching process, and a distance between the plurality of sapphire substrate layers 10-1, 10-2, 10-3 may be identical to a clearance between sub-pixels of a display.

First, if an LED apparatus 1000 before applying an etching process is used, for example, a display having a resolution of that illustrated in the bottom drawing of FIG. 12A may be manufactured.

If an LED apparatus 1000 after applying an etching process is used, for example, a display having a resolution of that illustrated in the bottom drawing of FIG. 12B may be manufactured.

That is, a resolution of a display may be varied according to whether an etching process is applied or not. Further, it is possible to manufacture a display having a desired resolution according to the degree of etching process applied.

Through the etching process, thousands of percent of high usage may be secured compared with a process of the related art from the same wafer area.

Figure 13:
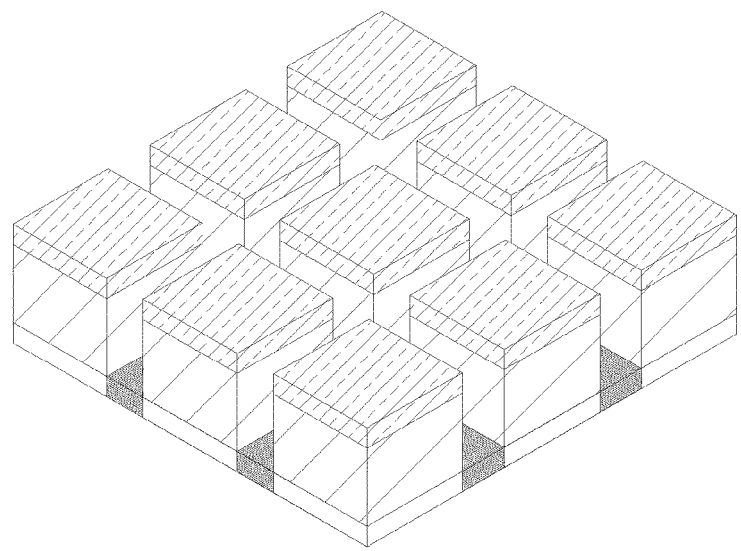
FIG. 13 illustrates a three-dimensional form of an LED apparatus in a manufacturing process, according to an exemplary embodiment.

FIG. 13 illustrates a three-dimensional form of an LED apparatus in a manufacturing process, according to an embodiment of the present disclosure.

A two-dimensional LED apparatus and the manufacturing method thereof were described above. However, this is only for convenience of explanation, and a three-dimensional LED apparatus may be manufactured as illustrated in FIG. 13 in the actual manufacturing process.

That is, a sapphire substrate layer 10 and a light-emitting diode layer 40 may be etched column-wise at predetermined intervals and may be etched row-wise at predetermined intervals.

Thereafter, an LED apparatus in the process of manufacturing process of FIG. 13 may be made upside down to form a black sealant 50 in an upper portion of the transparent heat sink plate 20. The black sealant 50 may be formed according to a plurality of columns and a plurality of rows to correspond to a pattern area of the transparent heat sink plate 20.

Thereafter, a fluorescence 30-1, 30-2, a glass layer 60, a color filter layer 70-1, 70-2, 70-3, a metallic material 80 and a plurality of pads 90 are formed, and a complete product of a display may thereby be manufactured.

Figure 14:
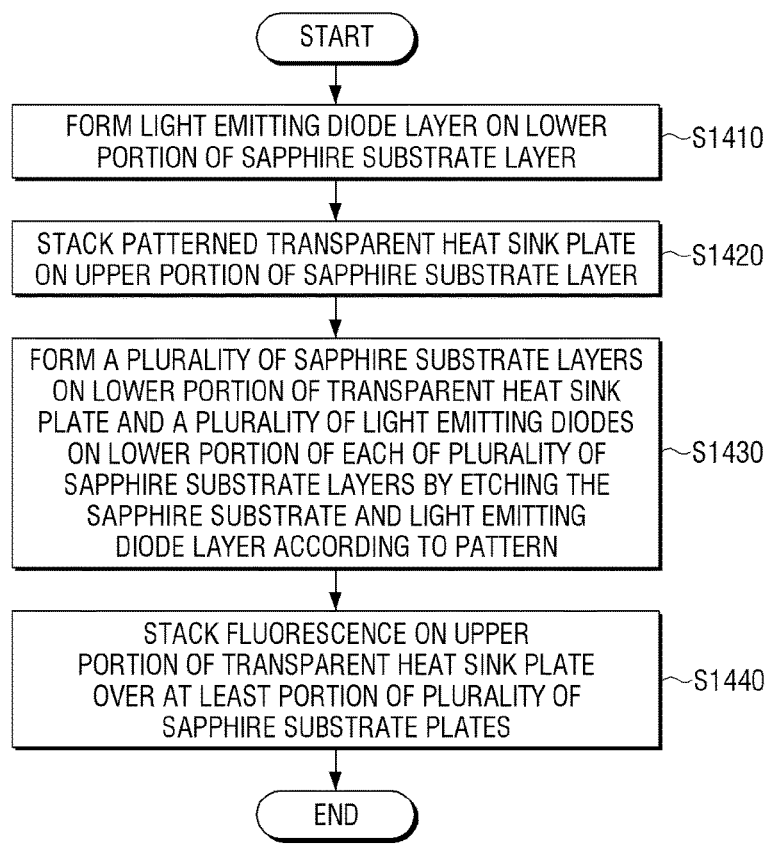
FIG. 14 is a flowchart illustrating a manufacturing method of an LED apparatus, according to an exemplary embodiment.

FIG. 14 is a flowchart illustrating a manufacturing method of an LED apparatus, according to an exemplary embodiment.

First, a light emitting diode layer 40 is formed on a lower portion of a sapphire substrate layer 10, at step S1410. Then, a patterned transparent heat sink plate 20 is stacked on an upper portion of the sapphire substrate layer 10, at step S1420. Then, a plurality of light emitting diodes 40-1, 40-2, 40-3 are formed on a lower portion of the transparent heat sink plate 20 and a plurality of light emitting diodes 40-1, 40-2, 40-3 are formed on a lower portion of each of the plurality of sapphire substrate layers 10-1, 10-2, 10-3 by etching the sapphire substrate 10 and the light emitting diode layer 40 according to the pattern (or following the pattern), at step S1430. Then, a fluorescence 30-1, 30-2 is stacked on an upper portion of the transparent heat sink plate 20 over at least a portion of the plurality of sapphire substrate layers 10-1, 10-2, 10-3, at step S1440.

The transparent heat sink plate 20 includes an area between adjacent sapphire substrate layers being patterned in black such that light emitted from the plurality of light emitting diodes 40-1, 40-2, 40-3 passing through each of the plurality of sapphire substrate layers are not mixed with one another in the area between the plurality of sapphire substrate layers being patterned in black.

The stacking the fluorescence 30-1, 30-2, at step S1440, may include stacking a first fluorescence 30-1 on an upper portion of a first sapphire substrate layer 10-1 corresponding to an R sub-pixel from among the plurality of sapphire substrate layers 10-1, 10-2, 10-3 and stacking a second fluorescence 30-2 on an upper portion of a second sapphire substrate layer 10-2 corresponding to a G sub-pixel from among the plurality of sapphire substrate layers 10-1, 10-2, 10-3.

Here, the method may further include forming a black sealant 50 on an upper portion of the patterned area of the transparent heat sink plate 20, and the first fluorescence 30-1 and the second fluorescence 30-2 may be formed between the black sealant 50.

The method may further include forming a glass layer 60 on upper portions of the black sealant 50 and the fluorescence 30-1, 30-2, and hardening the black sealant 50 by radiating ultraviolet rays (UV) on the glass layer 60, and the black sealant 50 may seal an area between the transparent heat sink plate 20 and the glass layer 60.

The fluorescence 30-1, 30-2 may convert a light incident from the plurality of sapphire substrate layers 10-1, 10-2, 10-3 into a wave of a corresponding sub-pixel and emits the converted light outside by diffusing the light through an internal diffuser.

The method may further include stacking a color filter layer 70-1, 70-2, 70-3 over at least one sub-pixel on an upper portion of the fluorescence 30-1, 30-2.

The method may further include coating with a metallic material 80 to surround a side surface of each of the plurality of sapphire substrate layers 10-1, 10-2, 10-3, and the metallic material 80 may reflect a light emitted to the side surface of the plurality of sapphire substrate layer to reflect the emitted light back into an interior of each of the plurality of sapphire substrate layers 10-1, 10-2, 10-3.

The method may further include forming a plurality of pads 90 to receive an external power on a lower portion of each of the plurality of light emitting diodes 40-1, 40-2, 40-3.

The transparent heat sink plate 20 may be patterned in a matrix form according to an array of a plurality of pixels of the LED apparatus.

The method may further include etching the sapphire substrate layer 10 and the light emitting diode layer 40 and then applying an etching process (e.g., a thinning process) to the transparent heat sink plate 20.

According to the various exemplary embodiments of the present disclosure, a heat sink performance may be enhanced to extend life of an apparatus even if a size of an LED apparatus is reduced, thereby reducing time to manufacture the apparatus.

It is described above that a chemical etching is used, but the exemplary embodiment is not limited thereto. For example, a sapphire substrate layer 10 and a light emitting diode layer 40 may be etched using a laser.

Further, it is described above that a display including a R, G and B sub-pixels is manufactured, but the exemplary embodiment is not limited thereto. For example, a fluorescence may not be used and a single-color lighting apparatus may be manufactured.

Further, it is described above that a set of R, G and B sub-pixels is used, but the exemplary embodiment is not limited thereto. For example, it is possible to separate R, G and B sub-pixels and use each of R, G and B sub-pixels individually.

The methods according to such various exemplary embodiments may be programmed and stored in various storage mediums. Accordingly, the methods according to the above-mentioned various exemplary embodiments may be realized in various types of electronic apparatuses to execute a storage medium.

Further, a non-transitory computer readable medium recording therein program to sequentially perform a control method according to exemplary embodiments may be provided.

The non-transitory recordable medium refers to a medium which may store data semi-permanently rather than storing data for a short time, such as register, cache, memory, etc. and is readable by an apparatus. Specifically, the above-described various applications and programs may be stored and provided in a non-transitory recordable medium such as compact disc (CD), digital versatile disc (DVD), hard disk, Blu-ray disk, universal serial bus (USB), memory card, ROM, etc.

However, the exemplary embodiments do not limit the inventive concept to only a particular encoding and decoding, and instead, the inventive concept may be applied to different types of encoding and decoding with necessary modifications. These modifications should also be understood to fall within the scope of the inventive concept.

While one or more exemplary embodiments have been described with reference to the figures, it will be understood by those of ordinary skill in the art that various changes in form and details may be made therein without departing from the spirit and scope as defined by the following claims.

What is claimed is:

1. A light emitting diode (LED) apparatus comprising:
   a plurality of substrate layers, each substrate layer of the plurality of substrate layers corresponding to one of a plurality of sub-pixels of a pixel;
   a heat sink plate provided on a first side of the plurality of substrate layers, the heat sink plate including a patterned area provided between adjacent substrate layers of the plurality of substrates layers;
   a fluorescence provided on the heat sink plate overlapping at least a portion of one of the plurality of substrate layers; and
   a plurality of light emitting diodes, each light emitting diode of the plurality of light emitting diodes being provided on a second side opposite to the first side of each substrate layer.

2. The apparatus as claimed in claim 1, wherein the patterned area of the heat sink plate is configured to prevent lights emitted from the plurality of light emitting diodes and passing through the plurality of substrate layers from mixing with one another.

3. The apparatus as claimed in claim 1, wherein the fluorescence comprises:
   a first fluorescence which is provided on a first side of a first substrate layer of the plurality of substrate layers, the first substrate layer corresponding to an R sub-pixel of the pixel; and
   a second fluorescence which is provided on a first side of a second substrate layer of the plurality of substrate layers, the second substrate layer corresponding to a G sub-pixel of the pixel.

4. The apparatus as claimed in claim 3, further comprising a black sealant provided on the patterned area of the heat sink plate,
   wherein the first fluorescence and the second fluorescence are provided between the black sealant.

5. The apparatus as claimed in claim 4, further comprising a glass layer provided on the black sealant and the fluorescence,
   wherein the black sealant seals an area between the heat sink plate and the glass layer.

6. The apparatus as claimed in claim 1, wherein the fluorescence is configured to convert a light incident from the at least the portion of one of the plurality of substrate layers into a wave of a corresponding sub-pixel, and to emit the converted light outside by diffusing the light.

7. The apparatus as claimed in claim 1, further comprising a color filter layer provided on the fluorescence and overlapping at least one sub-pixel of the pixel.

8. The apparatus as claimed in claim 1, further comprising a metallic material provided on a side surface of each substrate layer and configured to reflect a light emitted to the side surface of each of the plurality of substrate layers back into each substrate layer.

9. The apparatus as claimed in claim 1, further comprising a plurality of pads provided on each of the plurality of light emitting diodes and configured to receive an external power.

10. The apparatus as claimed in claim 1, wherein the plurality of substrate layers comprise at least one of a plurality of sapphire substrate layers and a plurality of silicon substrate layers.

11. The apparatus as claimed in claim 1, wherein the heat sink plate comprises a transparent heat sink plate.

12. The apparatus as claimed in claim 1, wherein the heat sink plate comprises a single heat sink plate.

13. A light emitting diode (LED) apparatus comprising:
   a plurality of substrate layers comprising:
      a first substrate layer corresponding to one of a R sub-pixel, a G sub-pixel and a B subpixel;
      a second substrate layer corresponding to one of a R sub-pixel, a G sub-pixel and a B subpixel; and
      a third substrate layer corresponding to one of a R sub-pixel, a G sub-pixel and a B subpixel, the first, second and third substrate layers corresponding to different sub-pixels;
   a single heat sink plate stacked on a first side of each of the first, second and third substrate layers, the heat sink plate including a patterned area corresponding to an area between adjacent substrate layers of the plurality of substrates layers;
a fluorescence stacked on the heat sink plate overlapping at least a portion of one of the plurality of substrate layers, the fluorescence comprising:
  a first fluorescence overlapping at least a portion of the first substrate layer; and
  a second fluorescence overlapping at least a portion of the second substrate layer; and
a plurality of light emitting diodes provided on a second side opposite to the first side of each of the first, second and third substrate layers.

14. The apparatus as claimed in claim 13, wherein the plurality of light emitting diodes is configured to emit an identical color light toward the first, second and third substrate layers, and
wherein the first and second fluorescence are configured to convert a light incident from the first and second substrate layers to a wave of a corresponding sub-pixel.

15. The apparatus as claimed in claim 13, wherein the patterned area of the heat sink plate is patterned in black and configured to prevent lights emitted from the plurality of light emitting diodes and passing through the plurality of substrate layers from mixed with one another.

16. The apparatus as claimed in claim 15 further comprising a black sealant stacked on the patterned area of the heat sink plate,
wherein the patterned area and the black sealant are configured to prevent lights emitted from the plurality of light emitting diodes and passing through the plurality of substrate layers from mixing with one another.

* * * * *